(12) United States Patent
Uchiyama (10) Patent No.: US 6,356,333 B1
(45) Date of Patent: Mar. 12, 2002

(54) CONDUCTIVE ADHESIVE WITH CONDUCTIVE PARTICLES, MOUNTING STRUCTURE, LIQUID CRYSTAL DEVICE AND ELECTRONIC DEVICE USING THE SAME

(75) Inventor: Kenji Uchiyama, Hotaka-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 09/448,552

(22) Filed: Nov. 23, 1999

(30) Foreign Application Priority Data

Nov. 25, 1998 (JP) .......................... 10-334212
Oct. 26, 1999 (JP) .......................... 11-304034

(51) Int. Cl.[7] ...................... G02F 1/1345; H01L 23/04
(52) U.S. Cl. ...................... 349/149; 349/150; 257/698
(58) Field of Search ...................... 349/122, 149, 349/150, 151, 152; 257/668, 698, 774, 780, 783, 787; 252/512

(56) References Cited

U.S. PATENT DOCUMENTS

| 5,502,889 A | * | 4/1996 | Casson et al. | ............... | 29/830 |
| 5,525,205 A | * | 6/1996 | Miyashita | ............... | 205/126 |
| 5,679,730 A | * | 10/1997 | Amano et al. | ............... | 523/415 |
| 5,727,310 A | * | 3/1998 | Casson et al. | ............... | 29/830 |
| 5,822,030 A | * | 10/1998 | Uchiyama | ............... | 349/149 |
| 5,861,661 A | * | 1/1999 | Tang et al. | ............... | 257/668 |
| 5,978,203 A | * | 11/1999 | Kiyomura et al. | ............ | 361/301.3 |
| 6,111,628 A | * | 8/2000 | Shiota et al. | ............... | 349/150 |
| 6,190,578 B1 | * | 2/2001 | Yokoyama et al. | ......... | 252/512 |

FOREIGN PATENT DOCUMENTS

| JP | 62-244142 A | * | 10/1987 |
| JP | 01-100993 A | * | 4/1989 |
| JP | 04-42547 A | * | 2/1992 |
| JP | 06-82749 A | * | 3/1994 |
| JP | 06-196513 A | * | 7/1994 |
| JP | 06-349339 A | * | 12/1994 |
| JP | 11-078317 A | * | 3/1999 |

* cited by examiner

*Primary Examiner*—William L. Sikes
*Assistant Examiner*—Tarifur R. Chowdhury
(74) *Attorney, Agent, or Firm*—Harness, Dickey & Pierce, P.L.C.

(57) ABSTRACT

A conductive adhesive which can withstand exposure to high temperature during a solder reflow process comprises an adhesive resin and a plurality of conductive particles mixed in the adhesive resin. The conductive particles each include a core formed of a synthetic resin and a conductive material coated around the core. The cores are each formed of a material having a thermal deformation temperature higher than that of the adhesive resin, and more preferably formed of a material having a thermal deformation temperature (18.6 kg/cm$^2$) higher than 120° C. as measured according to the measuring method defined in the ASTM standard D648, and still more preferably formed of a material selected from the group consisting of polyphenylene oxide, polysulfone, polycarbonate, polyacetal, and polyethylene terephthalate.

31 Claims, 6 Drawing Sheets

| | EPOXY RESIN | CURATIVE (CATALYTIC TYPE) | COMPOUNDING RATIO | REACTION RATE | CURING CONDITION | AMOUNT OF ADDED SILICA POWDER | HEAT DEFORMATION TEMPERATURE |
|---|---|---|---|---|---|---|---|
| SPECIFIC EXAMPLE 1 | BISPHENOL A POLYCARBONATE NOVOLAC | IMIDAZOLE | 100/5 | 84% | 210°C, 15 sec | 10% | 90~100°C |
| SPECIFIC EXAMPLE 2 | NAPHTHALENE | IMIDAZOLE | 100/5 | 84% | 210°C, 15 sec | 10% | 100~110°C |
| SPECIFIC EXAMPLE 3 | NAPHTHALENE | IMIDAZOLE | 100/5 | 90% | 220°C, 20 sec | 10% | 110~120°C |

CONDUCTIVE ADHESIVE WITH CONDUCTIVE PARTICLES, MOUNTING STRUCTURE, LIQUID CRYSTAL DEVICE AND ELECTRONIC DEVICE USING THE SAME

BACKGROUND OF THE INVENTION

1. Field of the Invention

The present invention relates to a conductive adhesive used to mount an electronic component on a substrate or the like, and more particularly, to a conductive adhesive comprising an adhesive resin and a plurality of conductive particles mixed in the adhesive resin. The present invention also relates to a mounting structure formed using such a conductive adhesive. The present invention also relates to a liquid crystal device formed using such a mounting structure. The present invention also relates to an electronic device formed using such a liquid crystal device. The present invention also relates to a method of producing a mounting structure, a liquid crystal device, and an electronic device.

2. Description of the Related Art

Liquid crystal devices are widely used in various electronic devices such as a portable telephone, a portable electronic terminal, etc. In many cases, liquid crystal devices are used to display information in the form of a character, a numeral, or a graphical image.

In general, a liquid crystal device includes a pair of liquid crystal substrates and a liquid crystal disposed between the pair of liquid crystal substrates wherein an electrode is formed on the inner surface of each substrate. The alignment of the liquid crystal is controlled by varying the voltage applied across the liquid crystal thereby modulating light incident on the liquid crystal. To control the voltage applied to the liquid crystal, it is required to use a liquid crystal driving integrated circuit, that is, a semiconductor chip, which is connected to the liquid crystal substrate directly or indirectly via a mounting structure.

In the case where the liquid crystal driving integrated circuit is connected indirectly to the liquid crystal substrate via the mounting structure, the mounting structure is formed, for example, by mounting the liquid crystal driving integrated circuit on a base substrate on which an interconnection pattern and electrode terminals are formed, and the resultant mounting structure is connected to the substrate of the liquid crystal device. In this case, when the liquid crystal driving integrated circuit is mounted on the base substrate, the liquid crystal driving integrated circuit may be connected to the base substrate using a conductive adhesive such as an ACF (anisotropic conductive film). More specifically, the liquid crystal driving integrated circuit and the base substrate are adhesively fixed to each other using an adhesive resin contained in the ACF such that bumps or terminals of the liquid crystal driving integrated circuit are electrically connected to electrode terminals on the base substrate via conductive particles contained in the ACF.

In some cases, when a semiconductor chip such as a liquid crystal driving integrated circuit is mounted on a base substrate, a passive electronic component such as a capacitor or a resistor or other electronic components such as a connector are also mounted on the base substrate via solder or the like, separately from the liquid crystal driving integrated circuit. Soldering for this purpose is generally performed using a solder reflow technique.

In the solder reflow technique, a solder pattern is first formed on a base substrate, at a predetermined location, by means of printing, dispensing, or the like, and a chip component such as the passive electronic component is placed on the solder pattern. The base substrate with the chip component placed thereon is then placed in a high-temperature furnace so as to melt the solder thereby soldering the chip component to the base substrate. In this process, the temperature of the heating furnace is set within the range of 200° C. to 250° C. The base substrate is exposed in a high-temperature region in this heating furnace for a short time. After completion of heating, the base substrate is cooled.

The conventional conductive adhesives such as an ACF used to mount a semiconductor chip include conductive particles formed of a synthesis resin such as polyester which is poor in heat resistance. Therefore, it is impossible to perform solder reflow processing after mounting a semiconductor chip on the base substrate using a conventional conductive adhesive. Thus, in conventional techniques, soldering of a chip component is first performed, and then the semiconductor chip is mounted using an ACF or the like.

In view of the above, it is an object of the present invention to provide a conductive adhesive which can withstand solder reflow processing. It is another object of the present invention to provide a mounting structure using such a conductive adhesive, a liquid crystal device using such a mounting structure, an electronic device using such a liquid crystal device. It is still another object of the present invention to provide a method of producing a mounting structure, a liquid crystal device, and an electronic device, using a simplified process.

SUMMARY OF THE INVENTION

1. According to an aspect of the invention, to achieve the above objects, there is provided a conductive adhesive comprising an adhesive resin and a plurality of conductive particles mixed in the adhesive resin, wherein: (1) each conductive particle comprises a core formed of a synthetic resin and a conductive material covering the core; and (2) the synthetic resin forming the core has a thermal deformation temperature higher than the thermal deformation temperature of the adhesive resin.

In this conductive adhesive, as described above, cores of the respective conductive particles contained in the conductive adhesive are made of a synthetic resin so that when two objects to be connected are brought into contact with each other via the conductive particles, the conductive particles are elastically deformed to a proper degree thereby achieving a stable contact between the two objects and thus achieving a stable electric connection between the two objects.

Furthermore, because the cores of the respective conductive particles contained in the conductive adhesive are formed using a synthetic resin having a high thermal deformation temperature, the conductive adhesive has high heat resistance. As a result, the conductive adhesive can withstand a solder reflow process in which the entire objects to be soldered are placed in a high temperature furnace. Therefore, it becomes possible to solder a chip component such as a capacitor to a base substrate by means of solder reflow processing after mounting a semiconductor chip on the base substrate using the conductive adhesive.

In the conductive adhesive described above, the adhesive resin may be a thermosetting resin such as an epoxy resin, a urethane resin, or an acrylic resin, wherein they have a thermal deformation temperature about 100° C. below which no deformation occurs. The conductive material covering the cores of the conductive adhesive may be, for example, nickel or carbon.

2. In the conductive adhesive described above, the synthetic resin forming the cores preferably has a thermal deformation temperature (18.6 kg/cm$^2$) equal to or higher than 120° C. as measured according to the measuring method defined in the ASTM (American Society of Testing Materials) standard D648. This allows the conductive adhesive to have higher heat resistance which ensures that the conductive adhesive withstands solder reflow processing.

3. The synthetic resin having a thermal deformation temperature higher than 120° C. as measured according to the ASTM-D648 standard may be selected from the group consisting of polyphenylene oxide, polysulfone, polycarbonate, polyacetal, and polyethylene terephthalate. If the cores of the conductive adhesive are formed using one of the synthetic resins described above, the conductive adhesive has high heat resistance which allows the conductive adhesive to withstand solder reflow processing. The characteristics of the respective synthetic resins described above are summarized in Table 1.

TABLE 1

|  | Thermal Deformation Temperature (° C.) | Linear Expansion Coefficient | Specific Gravity | Tensile Strength (kg/cm$^2$) |
|---|---|---|---|---|
| Polyphenylene Oxide | 193 | 4.9–5.6 | 1.06 | 700–770 |
| Polysulfone | 174 | 7.9 | 1.24 | 710 |
| Polycarbonate | 132 | 7 | 1.20 | 560–670 |
| Polyacetal | 124 | 8.1 | 1.42 | 700 |
| Polyethylene Terephthalate | 133–142 | 7.0 | 1.40 | 730 |

In Table 1, the respective characteristics are measured according to the standards described below:

Thermal Deformation Temperature: ASTM D648
Coefficient of Linear Expansion: ASTM D696
Specific Gravity: ASTM D792
Tensile Strength: ASTM D638

4. According to another aspect of the present invention, there is provided a mounting structure comprising a base substrate and a component mounted on the base substrate via a conductive adhesive, wherein: (1) the conductive adhesive is formed of an adhesive resin and a plurality of conductive particles mixed in the adhesive resin; (2) each conductive particle includes a core formed of a synthetic resin and a conductive material covering the core; and (3) the synthetic resin forming the core has a thermal deformation temperature higher than the thermal deformation temperature of the adhesive resin.

If this mounting structure is employed, it is possible to first mount a semiconductor chip on a base substrate using the conductive adhesive and then mount a chip component on the base substrate by means of solder reflow processing. Thus, the mounting structure is stable and has a high reliability.

The mounting structure may be produced in the form of a COB (chip on board) or a COF (chip on FPC). The mounting structure in the form of a COB may be produced by mounting a semiconductor chip or the like on a rather rigid and thick substrate such as an epoxy substrate. On the other hand, the mounting structure in the form of a COF may be produced by mounting a semiconductor or the like on a flexible and thin substrate such as a flexible printed circuit (FPC) substrate.

The flexible printed circuit substrate may be produced by forming an interconnection pattern using Cu or the like on a base layer made of polyimide or the like. If an interconnection pattern is directly formed on the base layer by means of a photolithography technique or the like, it is possible to achieve a two-layer FPC substrate. If an interconnection pattern is formed on the base layer via an adhesive layer, it is possible to a three-layer FPC substrate, wherein the adhesive layer serves as one of layers.

5. According to another aspect of the present invention, there is provided a liquid crystal device comprising: a liquid crystal panel including a liquid crystal disposed between a pair of substrates; and a mounting structure connected to the liquid crystal panel, wherein: (1) the mounting structure comprises a base substrate and a component mounted on the base substrate via a conductive adhesive; (2) the conductive adhesive is formed of an adhesive resin and a plurality of conductive particles mixed in the adhesive resin; (3) each conductive particle includes a core formed of a synthetic resin and a conductive material covering the core; and (4) the synthetic resin forming the core has a thermal deformation temperature higher than the thermal deformation temperature of the adhesive resin.

6. According to another aspect of the present invention, there is provided an electronic device including a mounting structure, wherein: (1) the mounting structure comprises a base substrate and a component mounted on the base substrate via a conductive adhesive; (2) the conductive adhesive is formed of an adhesive resin and a plurality of conductive particles mixed in the adhesive resin; (3) each conductive particle includes a core formed of a synthetic resin and a conductive material covering the core; and (4) the synthetic resin forming the core has a thermal deformation temperature higher than the thermal deformation temperature of the adhesive resin.

The electronic device may further include a liquid crystal device and a case in which the liquid crystal device is disposed, wherein the liquid crystal device comprises a liquid crystal panel including a liquid crystal disposed between a pair of substrates and wherein the liquid crystal panel is connected to the mounting structure.

7. According to another aspect of the present invention, there is provided a method of producing a mounting structure comprising a base substrate, a first component adhesively connected to the base substrate via a conductive adhesive, and a second component mounted on the base substrate by means of soldering, the method comprising the steps of: (1) mounting the first component on the base substrate via the conductive adhesive; and (2) mounting the second component on the base substrate by means of a solder reflow process after mounting the first component on the base substrate, wherein: (a) the conductive adhesive is formed of an adhesive resin and a plurality of conductive particles mixed in the adhesive resin; (b) each conductive particle includes a core formed of a synthetic resin and a conductive material covering the core; and (c) the synthetic resin forming the core has a thermal deformation temperature higher than the thermal deformation temperature of the adhesive resin.

In this method of producing a mounting structure, because the cores of the respective conductive particles contained in the conductive adhesive are formed using a synthetic resin having a high thermal deformation temperature, the conductive adhesive has high heat resistance. Therefore, when a chip component such as a capacitor is soldered to a base substrate by means of solder reflow processing after mounting a semiconductor chip on the base substrate using the conductive adhesive, the conductive adhesive can withstand exposure to a high temperature during the soldering process.

When a component is mounted using the solder reflow process, the process is influenced by contamination to a lesser degree than in the case where a component is mounted using a conductive adhesive such as an anisotropic conductive film, and does not require such high cleanliness level. Therefore, even if contamination occurs during a pre-process, the mounting process using the solder reflow technique hardly encounters problems. This results in suppression of occurrence of failures compared to the case where the mounting process using the conductive adhesive is performed after completion of the mounting process using the solder reflow technique.

8. According to another aspect of the present invention, there is provided a method of producing a liquid crystal device comprising: a liquid crystal panel including a liquid crystal disposed between a pair of substrates; and a mounting structure connected to said liquid crystal panel, the mounting structure comprising a base substrate, a first component adhesively connected to the base substrate via a conductive adhesive, and a second component mounted on the base substrate by means of soldering, the method comprising the steps of: (1) mounting the first component on the base substrate via the conductive adhesive; and (2) mounting the second component on the base substrate by means of a solder reflow process after mounting the first component on the base substrate, wherein: (a) the conductive adhesive is formed of an adhesive resin and a plurality of conductive particles mixed in the adhesive resin; (b) each conductive particle includes a core formed of a synthetic resin and a conductive material covering the core; and (c) the synthetic resin forming the core has a thermal deformation temperature higher than the thermal deformation temperature of the adhesive resin.

9. According to another aspect of the present invention, there is provided a method of producing an electronic device including a mounting structure comprising a base substrate, a first component adhesively connected to the base substrate via a conductive adhesive, and a second component mounted on the base substrate by means of soldering, the method comprising the steps of: (1) mounting the first component on the base substrate via the conductive adhesive of the present invention; and (2) mounting the second component on the base substrate by means of a solder reflow process after mounting the first component on the base substrate.

DESCRIPTION OF THE PREFERRED EMBODIMENT

First Embodiment

Figure 1:
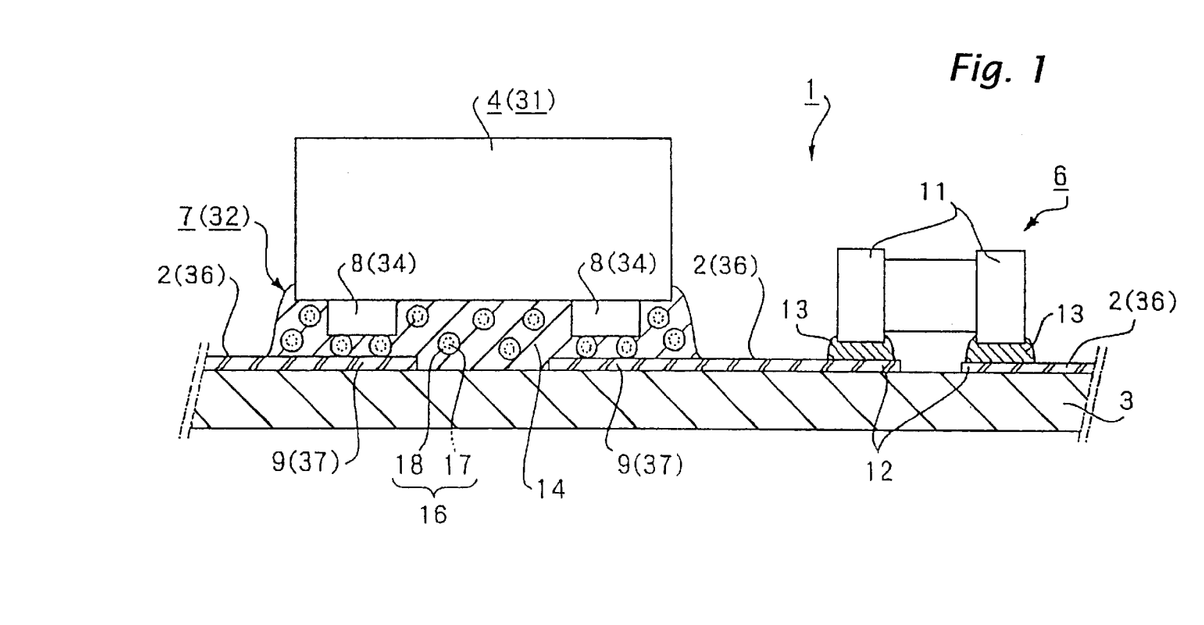
FIG. 1 is a cross-sectional view of an embodiment of a mounting structure using a conductive adhesive according to the present invention.

FIG. 1 illustrates the main parts of a mounting structure formed using a conductive adhesive according to an embodiment of the present invention. The mounting structure 1 shown in FIG. 1 is formed of a base substrate 3 with an interconnection pattern 2 formed thereon and components such as a semiconductor chip 4 and a chip component 6 mounted on the base substrate 3. Specific examples of chip components 6 include passive components such as a capacitor and a resistor and interconnection elements such as a connector. Note that FIG. 1 illustrates the respective elements in a schematic fashion in which the dimensional ratios of the respective elements are different from the actual dimensional ratios.

The base substrate 3 may be made of a rather rigid and thick material such as an epoxy resin or a flexible and thin material such as polyimide. The interconnection pattern 2 may be formed directly on the base substrate 3 using a known film formation technique such as photolithography or may be formed using an adhesive. Cu, copper alloy or the like may be employed as a material for the interconnection pattern 2.

The semiconductor chip 4 includes a plurality of bumps 8 serving as electrode terminals. The interconnection pattern 2 includes electrode terminals 9 formed in an area where the semiconductor chip 4 is mounted. The semiconductor chip 4 is mounted on the base substrate 3 via a conductive adhesive 7. Herein, "mounting" refers to a process of connecting the semiconductor chip 4 to the base substrate 3 into a state that satisfies both of the following conditions: the semiconductor chip 4 is mechanically fixed to the base substrate 3; and the respective bumps 8 of the semiconductor chip 4 are electrically connected to the corresponding electrode terminals 9 of the interconnection pattern formed on the base substrate 3.

More specifically, the mounting of the semiconductor chip 4 using the conductive adhesive 7 is performed as follows. After placing the semiconductor chip 4 on the base substrate 3 via the conductive adhesive 7, the semiconductor chip 4 is heated at a predetermined temperature and pressed with a predetermined pressure against the base substrate 3. That is, the semiconductor chip 4 is mounted by means of heating and pressing.

As for the conductive adhesive 7, an ACF (anisotropic conductive film) may be generally employed. The conductive adhesive 7 may be produced, for example, by mixing a plurality of conductive particles 17 into an adhesive resin 14. Herein, the adhesive resin 14 serves to mechanically connect the semiconductor chip 4 to the base substrate 3. The conductive particles 16 serve to electrically connect the respective bumps 8 of the semiconductor chip 4 to the corresponding electrode terminals 9 of the base substrate 3. Although the conductive particles 16 are schematically represented in an expanded fashion relative to the other potions in FIG. 1, the actual sizes of the conductive particles 16 are much smaller relative to the size of the semiconductor chip 4.

The chip component 6 has electrode terminals 11 formed on both of its ends. The interconnection pattern 2 includes electrode terminals 12 formed in the area where the chip component 6 is mounted. The chip component 6 is electrically and mechanically connected via solder 13 to a predetermined particular part of the base substrate 3, that is, mounted on the base substrate 3.

In the present embodiment, the chip component 6 is mounted after mounting the semiconductor chip 4 using the conductive adhesive 7.

The mounting of the chip component 6 may be performed by means of the solder reflow technique. More specifically, solder is formed into a desired pattern at a predetermined location on the base substrate 3 by means of printing, spraying, or coating. The chip component 6 is then placed on the solder, and the base substrate 3 with the chip component 6 is placed, for a short time, in a high-temperature furnace maintained, for example, at 200° C. to 250° C. When the base substrate 3 is exposed in a high-temperature ambient in the high-temperature furnace, the solder 13 melts and thus soldering is performed.

In the present embodiment, a thermosetting resin such as an epoxy resin, a urethane resin, or an acrylic resin may be employed as the adhesive resin 14 of the conductive adhesive 7. These resins have thermal deformation temperatures about 100° C. below which no thermal deformation occurs. Of these resins, if an epoxy resin is employed, the thermal deformation temperature or the heat resistance thereof can be adjusted by adjusting the skeleton of the epoxy resin, the molecular weight of each functional group of the epoxy resin, the skeleton of a curing agent, the molecular weight of each functional group of the curing agent, and the degree of cross-linking (conversion).

Figure 2:
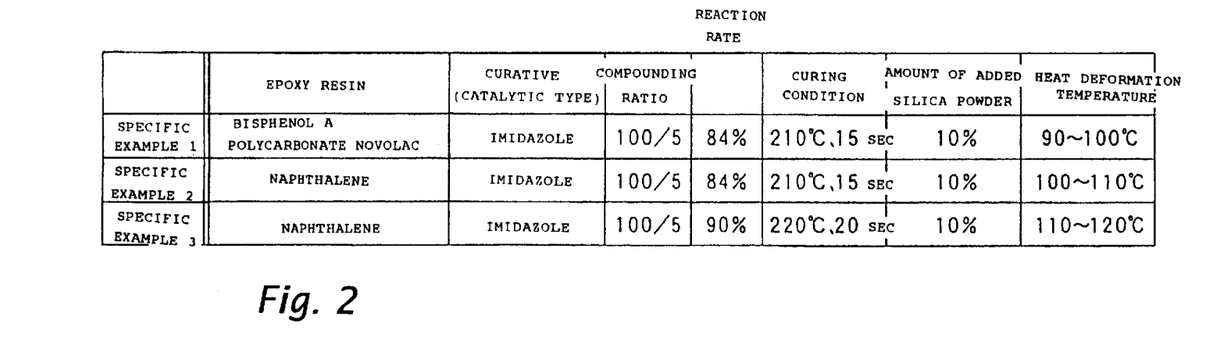
FIG. 2 is a table showing specific examples of adhesive resins forming the conductive adhesive.
Figure 3:
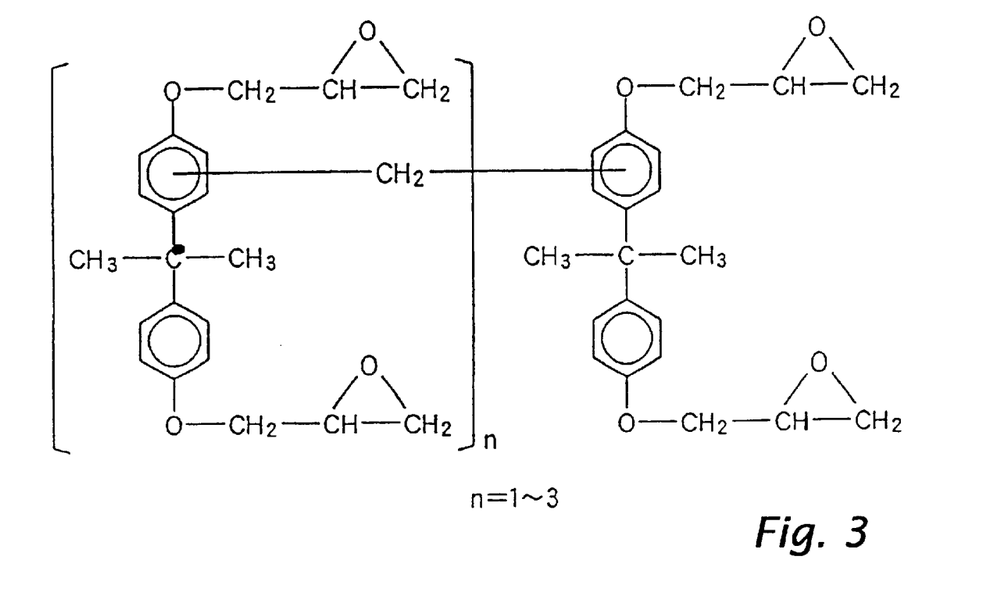
FIG. 3 shows the chemical structure of a bisphenol A novolac resin which may be employed as the adhesive resin.
Figure 4:
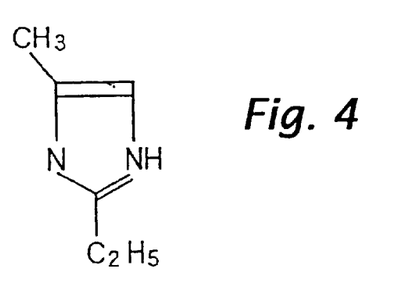
FIG. 4 shows the chemical structure of imidazole which may be employed as a curing agent.
Figure 6:
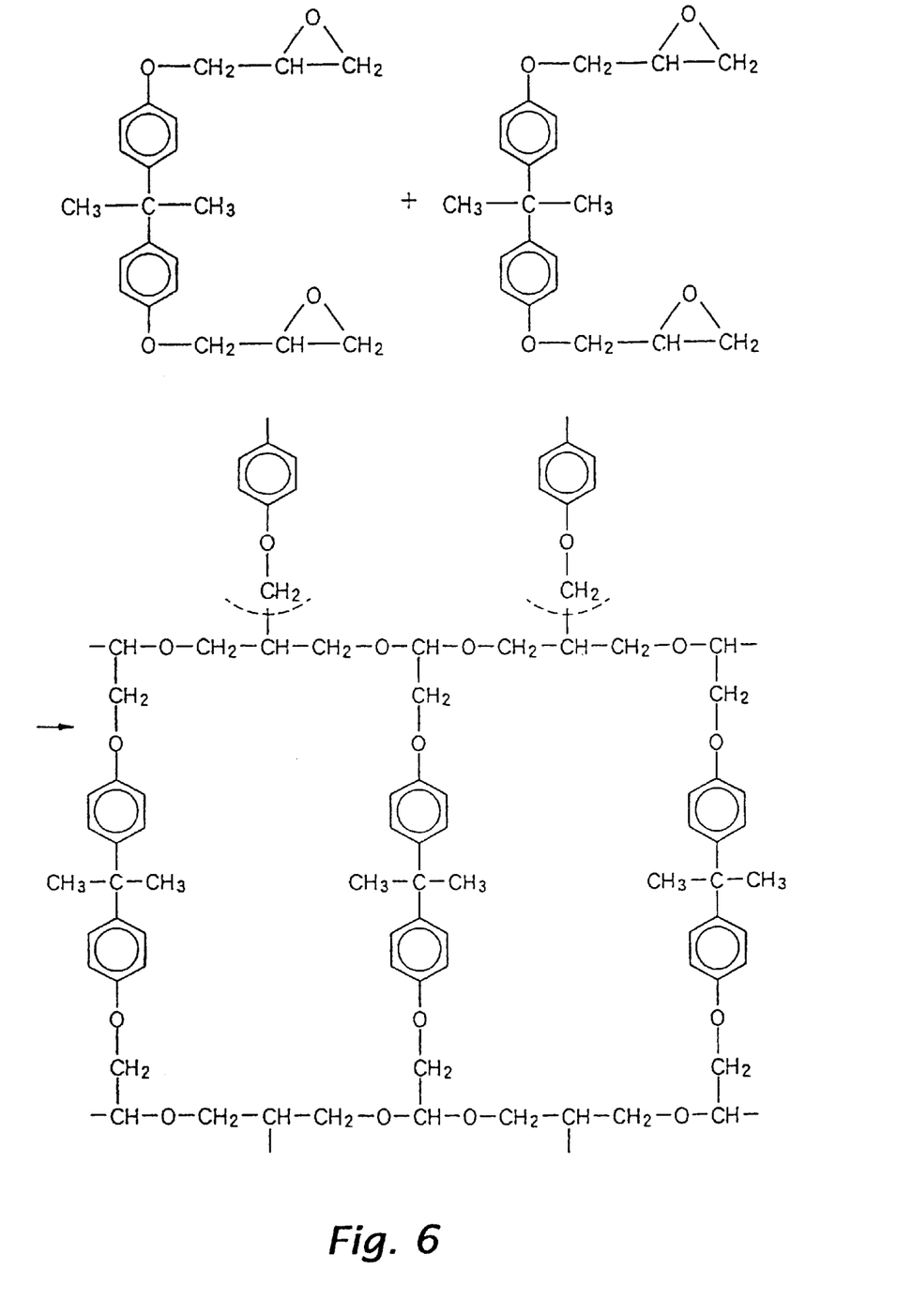
FIG. 6 illustrates an example of a reaction in a specific example 1 shown in FIG. 2.

FIG. 2 shows specific examples of the adhesive resins 14 using epoxy resins. In Specific Example 1, a bisphenol A novolac resin having the chemical structure shown in FIG. 3 is employed as the epoxy resin, and imidazole having the chemical structure shown in FIG. 4 is employed as the curing agent, wherein they are mixed in a ratio of 100:5 by weight. Furthermore, 10 wt % silica particles are added. The curing is performed at 210° C. for 15 sec. The degree of conversion is 84%. The thermal deformation temperature is 90 to 100° C. FIG. 6 illustrates an example of a reaction in Specific Example 1 for n=1.

Figure 5:
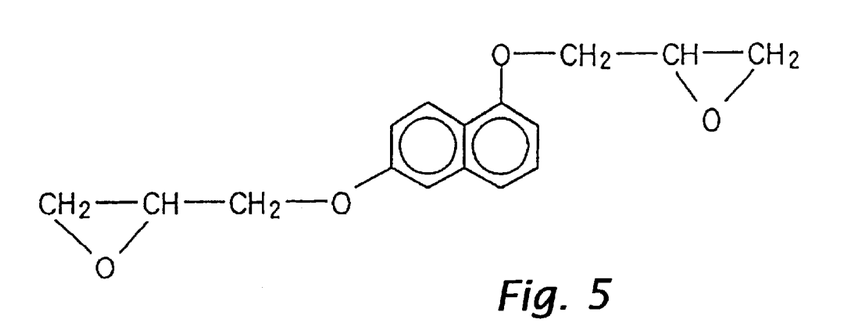
FIG. 5 shows the chemical structure of a naphthalene resin which may be employed as the adhesive resin.

In Specific Example 2, a naphthalene resin having the chemical structure shown in FIG. 5 is employed as the epoxy resin, and imidazole having the chemical structure shown in FIG. 4 is employed as the curing agent, wherein they are mixed in a ratio of 100:5 by weight. Furthermore, 10 wt % silica particles are added. The curing is performed at 210° C. for 15 sec. The degree of conversion is 84%. The thermal deformation temperature is 100 to 110° C.

In Specific Example 3, a naphthalene resin having the chemical structure shown in FIG. 5 is employed as the epoxy resin, and imidazole having the chemical structure shown in FIG. 4 is employed as the curing agent, wherein they are mixed in a ratio of 100:5 by weight. Furthermore, 10 wt % silica particles are added. The curing is performed at 220° C. for 20 sec. The degree of conversion is 90%. The thermal deformation temperature is 110 to 120° C.

As can be seen from Specific Examples 1 to 3, the thermal deformation temperature of the adhesive resin 14 can be adjusted by varying the composition thereof. As can be seen from a comparison between Specific Examples 2 and 3, the thermal deformation temperature of the adhesive resin 14 can be adjusted by varying the curing conditions while fixing the composition.

As illustrated in FIG. 1, the conductive particles 16 are formed by coating the entire core 17 of each particle with a conductive material 18.

The cores 17 are formed of a material having a thermal deformation temperature higher than that of the adhesive resin 14. Preferably, the thermal deformation temperature (18.6 kg/cm$^2$) is equal to or higher than 120° C. as measured according to the measuring method defined in the ASTM standard D648. More preferably, the material of the cores 17 is selected from the group consisting of polyphenylene oxide, polysulfone, polycarbonate, polyacetal, and polyethylene terephthalate.

As in the adhesive resin, the thermal deformation temperature or the heat resistance of the resin used to form the cores can also be adjusted by adjusting the molecular weight of each functional group of the resin, the skeleton of a curing agent, the molecular weight of each functional group of the curing agent, and the degree of cross-linking (conversion).

In conventional conductive adhesives, cores are formed of a material such as polyester having a thermal deformation temperature lower than that of epoxy resins. This makes it impossible to expose the conventional conductive adhesives to high temperature. As a result, the conventional conductive adhesives cannot be subjected to solder reflow processing. Therefore, when a conventional mounting structure is employed, solder reflow processing is not allowed to be performed after mounting a semiconductor chip on a base substrate via a conductive adhesive, and it is required to perform solder reflow processing associated with chip components before mounting semiconductor chips.

In the present embodiment, in contrast to the conventional technique, the cores 17 are formed of a material with a thermal deformation temperature higher than the thermal deformation temperature of the adhesive resin 14 so that the conductive adhesive 7 can withstand the solder reflow processing. Therefore, the chip component 6 may be mounted on the base substrate 3 by means of the solder reflow processing after mounting the semiconductor chip 4 on the base substrate 3 via the conductive adhesive 7, without causing the conductive particles 16 in the conductive adhesive 7 to be damaged by a high-temperature environment during the solder reflow processing.

In the present embodiment, the semiconductor chip 4 and the base substrate 3 are connected to each other via the conductive adhesive 7. However, objects to be connected by the conductive adhesive 7 are not limited to semiconductor chips and base substrates. Various types of objects may be connected using the conductive adhesive according to the present invention.

Second Embodiment

Figure 7:
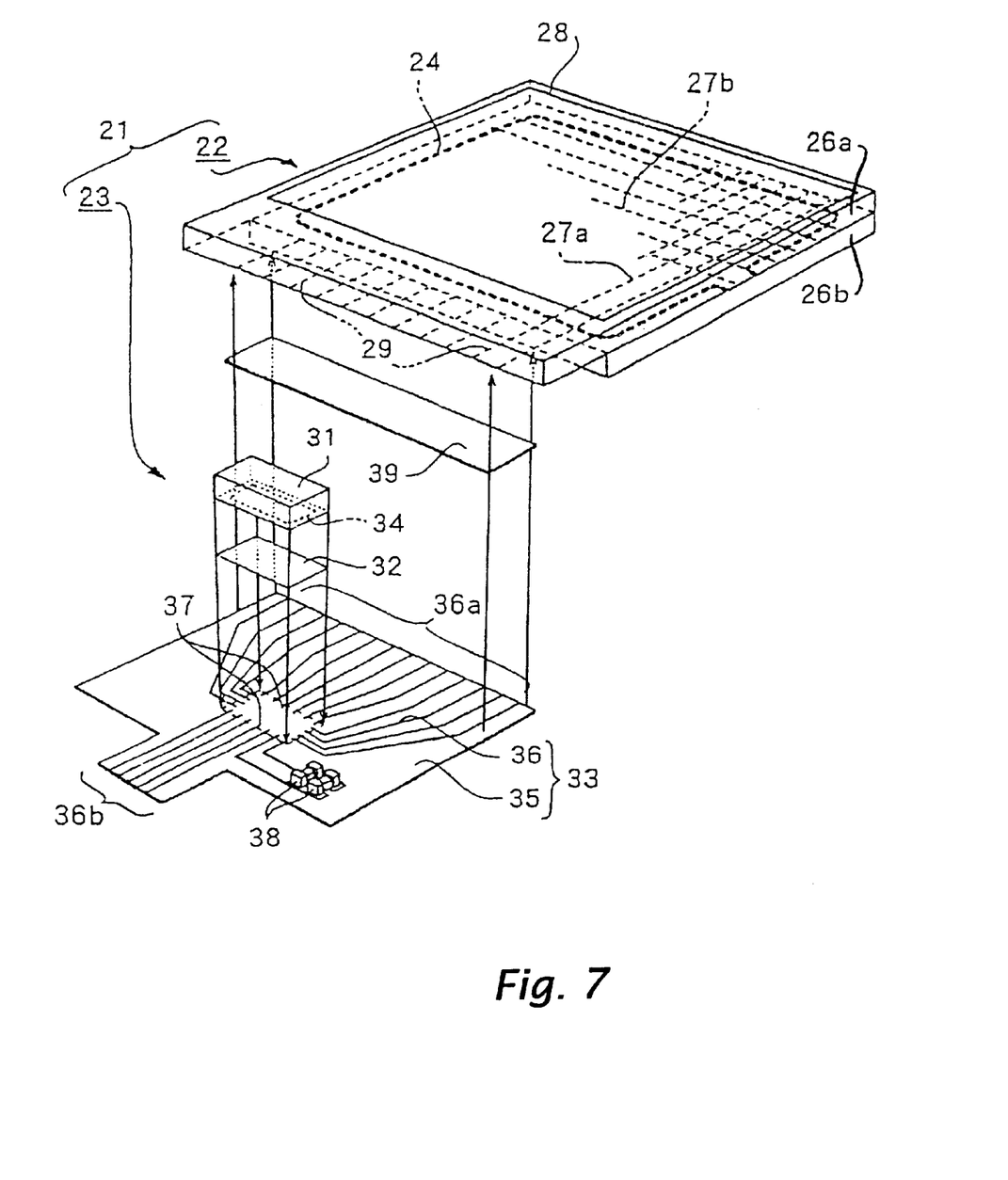
FIG. 7 is a schematic view of an embodiment of a liquid crystal device according to the present invention.

FIG. 7 illustrates an embodiment of a liquid crystal device according to the present invention. The liquid crystal device 21 shown in FIG. 7 is formed by connecting a mounting structure 23 to a liquid crystal panel 22. An illuminating device such as a backlight and other associated devices are also connected to the liquid crystal panel 22 as required.

The liquid crystal panel 22 includes a pair of substrates 26a and 26b connected to each other via a sealing member 24. A liquid crystal is sealed in a cell gap formed between the substrates 26a and 26b. The substrates 26a and 26b are generally formed of a transparent material such as glass or synthetic resin. A polarizer 28 is secured to the outer surface of each substrate 26a and 26b.

Electrodes 27a are formed on the inner surface of one substrate 26a, and electrodes 27b are formed on the inner surface of the other substrate 27b. These electrodes may be formed in the shape of stripes, characters, numerals, or other proper patterns. The electrodes 27a and 27b are formed of a transparent material such as ITO (indium tin oxide).

One substrate 26a has a protruding part extending outward beyond an edge of the other substrate 26b. A plurality of terminals 29 are formed on the protruding part. These terminals 29 are formed at the same time as the electrodes 27a are formed on the substrate 26a using the same material, that is, for example, ITO. The terminals 29 include terminals continuously extending from electrodes 27a and terminals connected to electrodes 27b via electrically conductive elements (not shown).

In practical applications, the electrodes 27a and 27b and the terminals 29 are formed on the substrate 26a or 26b in such a manner that a great number of these terminals are arranged at very small intervals. However, in FIG. 7, these electrodes and terminals are schematically represented in expanded intervals for a better understanding of their structure. Furthermore, of the greater number of these electrodes and terminals, only several electrodes or terminals are shown in FIG. 7. Connections between the terminals 29 and the electrodes 27a and connections between the terminals 29 and the electrodes 27b are not shown in FIG. 7.

The mounting structure 23 is formed by mounting a semiconductor chip, that is, liquid crystal driving integrated circuit 31 at a predetermined location on an interconnection substrate 33 and then mounting a chip component 38 at a predetermined location on the interconnection substrate 33.

The interconnection substrate 33 (the base substrate) is produced by forming an interconnection pattern 36 using Cu or the like on a base substrate 35 made of a flexible material such as polyimide. The interconnection pattern 36 may be formed by adhesively bonding a pattern to the base substrate 35 via an adhesive layer or may be formed directly on the base substrate 35 using a film formation technique such as sputtering or plating. The interconnection substrate 33 may also be produced by forming the interconnection pattern 36 using Cu or the like on a rather rigid and thick substrate such as a glass epoxy substrate.

If the interconnection substrate 33 is formed using a flexible substrate, and if a component is mounted thereon, a mounting structure in the form of a COF (chip on FPC) is obtained. On the other hand, if the interconnection substrate 33 is formed using a rigid substrate, and if a component is mounted thereon, a mounting structure in the form of a COB (chip on board) is obtained.

In FIG. 7, the interconnection pattern 36 includes output terminals 36a formed at one side of the mounting structure 23 and also includes input terminals 36b formed at the opposite side of the mounting structure 23. Of various parts of the interconnection pattern 36, parts extending into an area where the liquid crystal driving integrated circuit 31 is mounted form substrate terminals 37 (the electrode terminal of the base substrate).

The liquid crystal driving integrated circuit 31 has a plurality of bumps 34 serving as electrode terminals formed on a mounting surface, that is an active surface. The liquid crystal driving integrated circuit 31 is mounted at a particular location on the base substrate 35 via an ACF 32 serving as the conductive adhesive. The chip component 38 is mounted at another particular location on the base substrate 35 by means of soldering. Herein, the chip component 38 may be a passive component such as a capacitor or resistor or an electronic element such as a connector.

The ACF 32, as in the case of the conductive adhesive denoted by reference numeral 7 in FIG. 1, is formed by mixing a plurality of conductive particles 16 into an adhesive resin 14. Each conductive particle 16 is formed by entirely coating a core 17 with a conductive material 18. The materials of the core 17, the conductive material 18, and the adhesive resin 14 are all the same as those described above with reference to FIG. 1.

Figure 8:
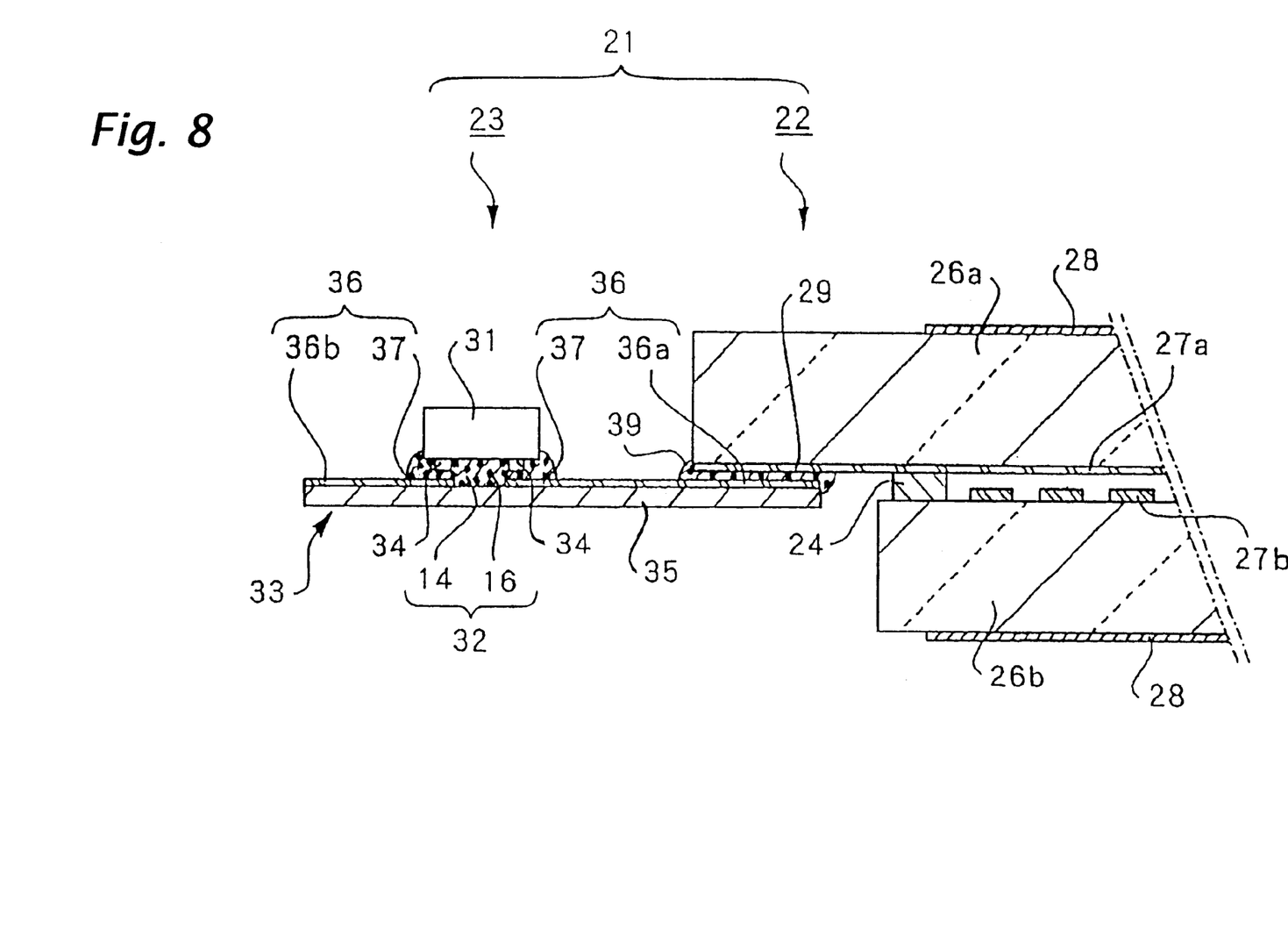
FIG. 8 is a cross-sectional view of the liquid crystal device shown in FIG. 7.

As shown in FIGS. 7 and 8, the liquid crystal driving integrated circuit 31 is firmly connected to the base substrate 35 by the adhesive resin 14 contained in the ACF 32, and the bumps 34 of the liquid crystal driving integrated circuit 31 are electrically connected via the conductive particles 16 contained in the ACF 32 to the substrate terminals 37 of the interconnection pattern 36.

The mounting structure 23 shown in FIG. 7 is produced as follows. First, an interconnection pattern 36 with a desired shape is formed on a base substrate 35 thereby producing an interconnection substrate 33. A liquid crystal driving integrated circuit 31 is then placed at a predetermined location on the interconnection substrate 33 via an ACF 32, and the liquid crystal driving integrated circuit 31 is subjected to a heating and pressing process so as to mount the liquid crystal driving integrated circuit 31 on the interconnection substrate 33.

After that, a solder pattern is formed, by means of printing or dispensing, on the interconnection substrate 33, at a location where a chip component 38 is to be mounted. The chip component 38 is then placed on the solder pattern. While maintaining this state, the interconnection substrate 33 is placed in a high-temperature furnace maintained at 200° C. to 250° C. for a short time so as to heat the interconnection substrate 33. After completion of heating, the interconnection substrate 33 is taken out of the furnace and cooled.

In this process, the interconnection substrate 33 is placed in the furnace for a period of time as short as possible but long enough to melt the solder. Thus, via the solder reflow process described above, the chip component 38 is mounted, via the solder, at the particular location on the interconnection substrate 33 on which the liquid crystal driving integrated circuit 31 has already been mounted.

The mounting structure 23 produced in the above-described manner is then connected via an ACF 39 to the protruding part of the substrate 26a of the liquid crystal panel 22. As in the case of the ACF 32, the ACF 39 is formed of an adhesive resin and conductive particles mixed therein. As shown in FIG. 8, the mounting structure 23 is firmly connected to the substrate 26a via the adhesive resin of the ACF 39, and the output terminals 36a of the mounting structure are electrically connected to the substrate terminals 29 of the substrate 26a via the conductive particles.

Herein, the ACF 32 used to mount the liquid crystal driving integrated circuit 31 includes, as shown in FIG. 1, conductive particles 16 each formed of a core 17 and a conductive material 18 coated on each core 17 wherein the core 17 is made of a material having a thermal deformation temperature higher than the thermal deformation temperature of the adhesive resin 14, and more preferably made of a material having a thermal deformation temperature (18.6 kg/cm$^2$) equal to or higher than 120° C. as measured according to the measuring method defined in the ASTM standard D648, and still more preferably made of a material selected from the group consisting of polyphenylene oxide, polysulfone, polycarbonate, polyacetal, and polyethylene terephthalate.

On the other hand, the cores 17 of the ACF 39 used to connect the mounting structure 23 to the substrate 26a of the liquid crystal panel 22 are not necessarily required to be formed using such a special material, and an ACF of a widely used type may also be employed. Of course, an ACF similar to the ACF 32 used to mount the liquid crystal driving integrated circuit 31 may be employed as the ACF 39.

In the liquid crystal device 21 of the present embodiment, as described above, the core 17 (refer to FIG. 1) of each conductive particle 16 contained in the ACF 32 used to mount the liquid crystal driving integrated circuit 31 of the mounting structure 23 is made of a material having a thermal deformation temperature higher than the thermal deformation temperature of the adhesive resin 14, and more preferably made of a material having a thermal deformation temperature (18.6 kg/cm²) higher than 120° C. as measured according to the measuring method defined in the ASTM standard D648, and still more preferably made of a material selected from the group consisting of polyphenylene oxide, polysulfone, polycarbonate, polyacetal, and polyethylene terephthalate such that the conductive particles 16 have a thermal characteristic withstanding the solder reflow process. Thus, it becomes possible to mount a chip component 38 on an interconnection substrate 33 using solder reflow processing after mounting a liquid crystal driving integrated circuit 31 on the interconnection substrate 33 using an ACF 32.

Third Embodiment

Figure 9:
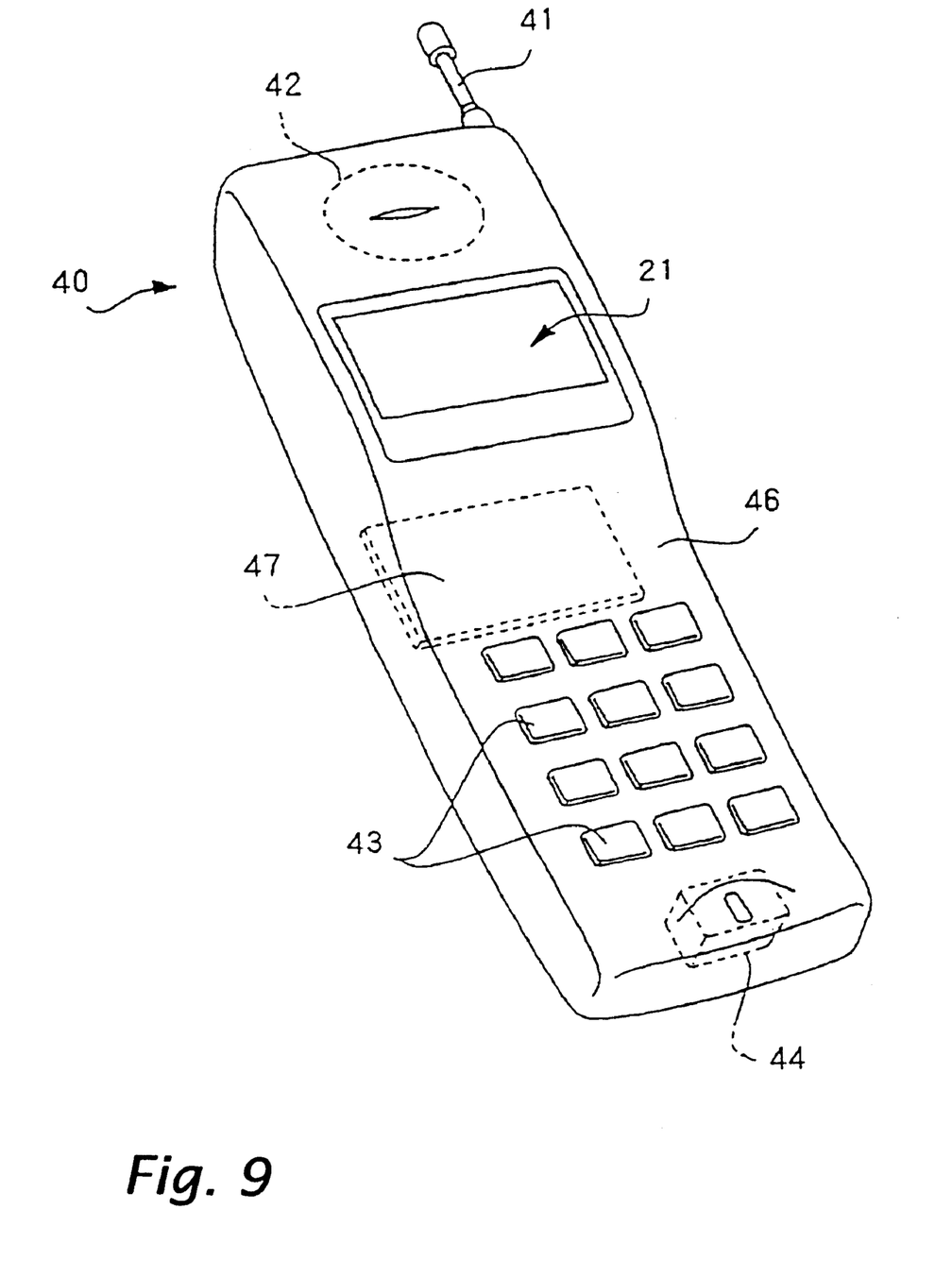
FIG. 9 is a schematic view of a portable telephone which is an example of an embodiment of an electronic device according to the present invention.

FIG. 9 illustrates a portable telephone which is an embodiment of an electronic device according to the present invention. The portable telephone 40 comprises an antenna 41, a loudspeaker 42, a liquid crystal device 21, key switches 43, a microphone 44, etc., wherein these components are disposed in a case 46. In the inside of the case 46, there is also provided a control circuit board 47 on which a control circuit for controlling the above-described components is disposed. The liquid crystal device 21 described above with reference to FIG. 7 may be employed herein as the liquid crystal device 21.

In this portable telephone 40, signals input via the microphone 44 or key switches 43 and a signal received via the antenna 41 are applied to the control circuit on the control circuit board 47. According to the input data, the control circuit displays an image such as a numeral, a character, or a graphical pattern in the display area of the liquid crystal device 21. Then the data is transmitted via antenna 41.

Other Embodiments

The present invention has been described above with reference to preferred embodiments. However, the present invention is not limited to those embodiments and various modifications are possible without departing from the scope of the invention as defined by the appended claims.

More specifically, although in the embodiment shown in FIG. 1, the semiconductor chip is mounted on the substrate 3 via the conductive adhesive according to the invention, the conductive adhesive according to the invention may also be used to connect two arbitrary objects to each other in such a manner that main parts of the respective objects are mechanically connected to each other and electrodes of the respective objects are electrically connected to each other.

Furthermore, the liquid crystal device shown in FIG. 7 has been described only by way of example, and the present invention may be applied to various liquid crystal devices having different structures. For example, although in the liquid crystal device shown in FIG. 7, only one mounting structure is connected to the liquid crystal panel, the present invention may also be employed when a plurality of mounting structures are connected to a liquid crystal panel.

Furthermore, although in the embodiment shown in FIG. 9, the present invention is applied to a portable telephone taken as an example of an electronic device, the invention may also be applied to other types of electronic devices such as a portable information terminal, an electronic personal organizer, a viewfinder of a video camera, etc.

As described above, the present invention provides great advantages. That is, the cores of the respective conductive particles contained in the conductive adhesive are made of a synthetic resin so that when two objects to be connected are brought into contact with each other via the conductive particles, the conductive particles are elastically deformed to a proper degree thereby achieving a stable contact between the two objects and thus achieving a stable electric connection between the two objects.

Furthermore, because the cores of the respective conductive particles contained in the conductive adhesive are formed using a synthetic resin having a high thermal deformation temperature, the conductive adhesive has high heat resistance. As a result, the conductive adhesive can withstand a solder reflow process in which the entire object to be soldered is placed in a high temperature furnace. Therefore, it becomes possible to mount a chip component such as a capacitor on a base substrate by means of solder reflow processing after mounting a semiconductor chip on the base substrate using the conductive adhesive.

What is claimed is:

1. A conductive adhesive comprising an adhesive resin able to withstand a solder reflow process and a plurality of conductive particles mixed in said adhesive resin, wherein:

each of said conductive particles comprises a core formed of a synthetic resin and a conductive material covering said core; and the synthetic resin forming said core has a thermal deformation temperature higher than that of said adhesive resin.

2. A conductive adhesive according to claim 1, wherein said synthetic resin forming said core has a thermal deformation temperature (18.6 kg/cm²) equal to or higher than 120° C. as measured according to the measuring method defined in the ASTM (American Society of Testing Materials) standard D648.

3. A conductive adhesive according to claim 1, wherein said synthetic resin is selected from the group consisting of polyphenylene oxide, polysulfone, polycarbonate, polyacetal, and polyethylene terephthalate.

4. A mounting structure having a semiconductor chip mounted on a substrate comprising:

an interconnection pattern formed on the substrate;

a bump formed on the semiconductor chip, wherein the conductive adhesive of claim 1 is disposed between the interconnection pattern and the bump such that the interconnection pattern and the bump are connected with each other via the conductive particles; and a chip component mounted on the interconnection pattern with solder.

5. A mounting structure comprising a base substrate and a components mounted on said base substrate via a conductive adhesive, wherein:

said conductive adhesive is formed of an adhesive resin able to withstand a solder reflow process and a plurality of conductive particles mixed in said adhesive resin;

each of said plurality of conductive particles includes a core formed of a synthetic resin and a conductive material covering said core; and said synthetic resin forming the core has a thermal deformation temperature higher than the thermal deformation temperature of said adhesive resin.

6. An electronic device including a mounting structure according to claim 5.

7. An electronic device according to claim 6, wherein said electronic device includes a liquid crystal device and wherein said mounting structure is connected to said liquid crystal device.

8. A mounting structure according to claim 5, further comprising:

a semiconductor chip;

an interconnection pattern formed on the substrate;

a bump formed on the semiconductor chip, said conductive adhesive, being disposed between said interconnection pattern and the bump such that the interconnection pattern and the bump are connected with each other via the conductive particles; and a chip component mounted on the interconnection pattern with solder.

9. A liquid crystal device comprising:

a liquid crystal panel including a liquid crystal disposed between a pair of substrates; and a mounting structure connected to said liquid crystal panel, wherein:

said mounting structure comprises a base substrate and a component mounted on said base substrate via a conductive adhesive;

said conductive adhesive is formed of an adhesive resin able to withstand a solder reflow process and a plurality of conductive particles mixed in said adhesive resin;

each of said plurality of conductive particles includes a core formed of a synthetic resin and a conductive material covering said core; and said synthetic resin forming the core has a thermal deformation temperature higher than the thermal deformation temperature of said adhesive resin.

10. A method of producing a mounting structure comprising a base substrate, a first component adhesively connected to said base substrate via a conductive adhesive, and a second component mounted on said base substrate by means of a solder reflow process, said method comprising the steps of:

mounting said first component on said base substrate via the conductive adhesive which includes an adhesive resin able to withstand said solder reflow process and a plurality of conductive particles mixed in said adhesive resin, wherein each of said conductive particles includes a core formed of a synthetic resin covered by a conductive material, wherein said synthetic core has a thermal deformation temperature higher than the thermal deformation temperature of said adhesive resin; and mounting said second component on said base substrate by means of said solder reflow process.

11. A method of producing a mounting structure according to claim 10 wherein said mounting of second component on said base substrate by means of said solder reflow process is performed after mounting said first component on said base substrate via the conductive adhesive.

12. A method of producing a liquid crystal device having a liquid crystal panel including a liquid crystal disposed between a pair of substrates; and a mounting structure connected to said liquid crystal panel, said mounting structure comprising a base substrate, a first component adhesively connected to said base substrate via a conductive adhesive, and a second component mounted on said base substrate by means of a solder reflow process, said method comprising the steps of:

mounting said first component on said base substrate via the conductive adhesive which includes an adhesive resin able to withstand said solder reflow process and a plurality of conductive particles mixed in said adhesive resin, wherein each of said conductive particles includes a core formed of a synthetic resin covered by a conductive material, wherein said synthetic core has a thermal deformation temperature higher than the thermal deformation temperature of said adhesive resin; and mounting said second component on said base substrate by means of said solder reflow process.

13. A method of producing a liquid crystal device according to claim 12, wherein said mounting of second component on said base substrate by means of said solder reflow process is performed after mounting said first component on said base substrate via the conductive adhesive.

14. A method of producing an electronic device including a mounting structure, said mounting structure comprising a base substrate, a first component adhesively connected to said base substrate via a conductive adhesive, and a second component mounted on said base substrate by means of a solder reflow process, said method comprising the steps of:

mounting said first component on said base substrate via the conductive adhesive which includes an adhesive resin able to withstand said solder reflow process and a plurality of conductive particles mixed in said adhesive resin, wherein each of said conductive particles includes a core formed of a synthetic resin covered by a conductive material, wherein said synthetic core has a thermal deformation temperature higher than the thermal deformation temperature of said adhesive resin; and mounting said second component on said base substrate by means of said solder reflow process.

15. A method of producing an electronic device according to claim 14, wherein said mounting of second component on said base substrate by means of said solder reflow process is performed after mounting said first component on said base substrate via the conductive adhesive.

16. A conductive adhesive comprising an adhesive resin and a plurality of conductive particles mixed in said adhesive resin, wherein:

each of said conductive particles comprises a core formed of a synthetic resin and a conductive material covering said core; and said core has a thermal deformation temperature higher than that of said adhesive resin such that said core is able to withstand a solder reflow process.

17. A mounting structure comprising a base substrate and a component mounted on said base substrate via a conductive adhesive, wherein:

said conductive adhesive is formed of an adhesive resin and a conductive particle mixed in said adhesive resin;

said conductive particle includes a core formed of a synthetic resin and a conductive material covering said core; and said core has a thermal deformation temperature higher than the thermal deformation temperature of said adhesive resin such that said core is able to withstand a solder reflow process.

18. A mounting structure according to claim 17, further comprising:

a semiconductor chip;

a terminal formed on the substrate;

a bump formed on the semiconductor chip;

said conductive adhesive, being disposed between said terminal and said bump such that the terminal and the bump are connected with each other via the conductive particle; and a chip component mounted on the substrate via a solder reflow process.

19. A mounting structure according to claim 17, further comprising a plurality of conductive particles.

20. A liquid crystal device comprising:

a liquid crystal panel including a liquid crystal disposed between a pair of substrates; and a mounting structure connected to said liquid crystal panel, wherein:

said mounting structure comprises a base substrate and a component mounted on said base substrate via a conductive adhesive;

said conductive adhesive is formed of an adhesive resin and a conductive particle mixed is said adhesive resin;

said conductive particle includes a core formed of a synthetic resin and a conductive material covering said core; and said core has a thermal deformation temperature higher than the thermal deformation temperature of said adhesive resin such that said core is able to withstand a solder reflow process.

21. A liquid crystal device according to claim 20, further comprising:

an electrode for driving the liquid crystal;

an interconnection pattern formed on said base substrate, one end of the interconnection pattern being connected to the electrode;

a semiconductor chip with a bump, wherein the bump is connected to a terminal that is formed at the other end of the interconnection pattern; and a chip component mounted on the base substrate via solder reflow process.

22. A method of producing a mounting structure comprising a base substrate, a first component adhesively connected to said base substrate via a conductive adhesive, and a second component mounted on said base substrate by means of a solder reflow process, said method comprising the steps of:

mounting said first component on said base substrate via the conductive adhesive which includes an adhesive resin and a conductive particle mixed in said adhesive resin, wherein said conductive particle includes a core formed of a synthetic resin covered by a conductive material, wherein said synthetic core has a thermal deformation temperature higher than the thermal deformation temperature of said adhesive resin; and mounting said second component on said base substrate by means of said solder reflow process.

23. A method of producing a liquid crystal device according to claim 22, wherein said mounting of second component on said base substrate by means of said solder reflow process is performed after mounting said first component on said base substrate via the conductive adhesive.

24. A method of producing a liquid crystal device having a liquid crystal panel including a liquid crystal disposed between a pair of substrates; and a mounting structure connected to said liquid crystal panel, said mounting structure comprising a base substrate, a first component adhesively connected to said base substrate via a conductive adhesive, and a second component mounted on said base substrate by means of a solder reflow process, said method comprising the steps of:

mounting said first component on said base substrate via the conductive adhesive which includes an adhesive resin and a conductive particle mixed in said adhesive resin, wherein said conductive particle includes a core formed of a synthetic resin covered by a conductive material, wherein said synthetic core has a thermal deformation temperature higher than the thermal deformation temperature of said adhesive resin; and mounting said second component on said base substrate by means of said solder reflow process.

25. A method of producing a liquid crystal device according to claim 24, wherein said mounting of second component on said base substrate by means of said solder reflow process is performed after mounting said first component on said base substrate via the conductive adhesive.

26. A method of producing an electronic device including a mounting structure, said mounting structure comprising a base substrate, a first component adhesively connected to said base substrate via a conductive adhesive, and a second component mounted on said base substrate by means of a solder reflow process, said method comprising the steps of:

mounting said first component on said base substrate via the conductive adhesive which includes an adhesive resin and a conductive particle mixed in said adhesive resin, wherein said conductive particle includes a core formed of a synthetic resin covered by a conductive material, wherein said synthetic core has a thermal deformation temperature higher than the thermal deformation temperature of said adhesive resin; and mounting said second component on said base substrate by means of said solder reflow process.

27. A method of producing an electronic device according to claim 26, wherein said mounting of second component on said base substrate by means of said solder reflow process is performed after mounting said first component on said base substrate via the conductive adhesive.

28. An electronic device comprising:

a display panel;

a substrate bonded to the display panel;

a semiconductor chip mounted on the substrate;

a conductive adhesive which includes an adhesive resin and a conductive particle mixed therein, disposed between the substrate and the semiconductor chip so that the conductive particle connects the substrate to the semiconductor chip, wherein the conductive particle includes a core made of a synthetic resin; and a chip component mounted on the substrate via a solder reflow process;

wherein the core of said conductive particle is able to withstand a solder reflow process.

29. A conductive adhesive comprising:

an adhesive resin; and a conductive particle mixed in the adhesive resin, wherein the conductive particle comprises a core formed of a synthetic resin that has a certain thermal deformation temperature, and wherein the core is able to withstand a temperature of a solder reflow process.

30. A method for mounting a semiconductor comprising the steps of:

disposing an adhesive resin with a conductive particle, wherein the conductive particle includes a core at the center portion thereof, a thermal deformation temperature of the core being equal to or higher than 120 C., and a thermal deformation temperature of the resin being between 90 C. and 120 C.;

placing a semiconductor chip on the adhesive resin;

compressing a semiconductor to the substrate; and soldering a chip component on the substrate by means of a solder reflow process, wherein a temperature of said solder reflow process is between 200 C. to 250 C.

31. A method for manufacturing a liquid crystal display device, wherein the liquid crystal display device includes a pair of substrates opposing each other, one of the substrates being with an electrode for driving liquid crystal sealed therebetween; and a base substrate with an interconnection pattern, one end of the interconnection pattern being connected to the electrode, the method comprising the step of:

disposing an adhesive resin with a conductive particle on another end of the interconnection pattern, wherein the conductive particle includes a core, a thermal deformation temperature of the core being equal to or higher than 120 C., and a thermal deformation temperature of the adhesive resin being between 90 C. and 120 C.

* * * * *

UNITED STATES PATENT AND TRADEMARK OFFICE
CERTIFICATE OF CORRECTION

PATENT NO.    : 6,356,333 B1
DATED         : March 12, 2002
INVENTOR(S)   : Kenji Uchiyama It is certified that error appears in the above-identified patent and that said Letters Patent is hereby corrected as shown below:

Column 4,
Line 6, after "to" insert -- achieve --.
Line 7, after "of" insert -- the --.

Column 6,
Line 55, "potions" should be -- portions --.

Column 12,
Line 45, "components" should be -- component --.

Column 15,
Line 10, "is" should be -- in --.
Line 31, after "via" insert -- a --.
Line 49, "liquid crystal device" should be -- mounting structure --.

Column 16,
Line 67, "120C" should be -- 120ºC --.

Column 17,
Line 2, "90 C and 120 C" should be -- 90ºC and 120ºC --.
Line 8, "200 C" should be -- 200ºC --.

Column 18,
Line 9, "120 C" should be -- 120ºC --.
Line 10, "90 C and 120 C" should be -- 90ºC and 120ºC --.

Signed and Sealed this

Sixteenth Day of July, 2002

*Attest:*

JAMES E. ROGAN
*Attesting Officer*  *Director of the United States Patent and Trademark Office*